(12) United States Patent
He

(10) Patent No.: US 11,069,632 B2
(45) Date of Patent: Jul. 20, 2021

(54) ARRAY SUBSTRATE AND MANUFACTURING METHOD THEREOF

(71) Applicant: Wuhan China Star Optoelectronics Technology Co., Ltd., Hubei (CN)

(72) Inventor: Chao He, Hubei (CN)

(73) Assignee: WUHAN CHINA STAR OPTOELECTRONICS TECHNOLOGY CO., LTD., Hubei (CN)

( * ) Notice: Subject to any disclaimer, the term of this patent is extended or adjusted under 35 U.S.C. 154(b) by 0 days.

(21) Appl. No.: 16/614,565

(22) PCT Filed: Sep. 16, 2019

(86) PCT No.: PCT/CN2019/105900
§ 371 (c)(1),
(2) Date: Nov. 18, 2019

(87) PCT Pub. No.: WO2020/232920
PCT Pub. Date: Nov. 26, 2020

(65) Prior Publication Data
US 2020/0411455 A1     Dec. 31, 2020

(30) Foreign Application Priority Data
May 22, 2019   (CN) .......................... 201910430461.5

(51) Int. Cl.
*H01L 23/60*     (2006.01)
*H01L 27/12*     (2006.01)
*H01L 23/552*    (2006.01)

(52) U.S. Cl.
CPC .......... *H01L 23/60* (2013.01); *H01L 27/1248* (2013.01); *H01L 27/1262* (2013.01); *H01L 23/552* (2013.01)

(58) Field of Classification Search
CPC combination set(s) only.
See application file for complete search history.

(56) References Cited

U.S. PATENT DOCUMENTS

| | | | |
|---|---|---|---|
| 9,836,155 B2* | 12/2017 | Ming | H04N 13/332 |
| 2010/0230763 A1* | 9/2010 | Sun | H01L 27/14609 |
| | | | 257/390 |
| 2010/0320466 A1* | 12/2010 | Chen | H01L 27/1288 |
| | | | 257/59 |
| 2015/0028341 A1* | 1/2015 | Sun | H01L 29/78633 |
| | | | 257/72 |

(Continued)

FOREIGN PATENT DOCUMENTS

| | | |
|---|---|---|
| CN | 103163668 A | 6/2013 |
| CN | 107946321 A | 4/2018 |

*Primary Examiner* — Mamadou L Diallo
(74) *Attorney, Agent, or Firm* — Hamre, Schumann, Mueller & Larson, P.C.

(57) ABSTRACT

The present disclosure provides an array substrate. The array substrate includes a plurality of shielding layers disposed on a glass substrate and arranged at intervals; a dielectric layer spread on the glass substrate and covering the shielding layers, wherein the dielectric layer includes a plurality of dielectric patterns, the dielectric patterns include main dielectric patterns and auxiliary dielectric patterns disposed on at least one side of the main dielectric patterns; and a gate insulating layer disposed on the dielectric layer.

18 Claims, 2 Drawing Sheets

(56) References Cited

U.S. PATENT DOCUMENTS

| | | | |
|---|---|---|---|
| 2016/0328039 A1* | 11/2016 | Lin | G06F 3/0443 |
| 2018/0122852 A1* | 5/2018 | Nishimura | H01L 27/14683 |
| 2018/0166435 A1 | 6/2018 | Lee et al. | |
| 2018/0356664 A1* | 12/2018 | Yang | H01L 27/1222 |
| 2019/0064568 A1* | 2/2019 | Zheng | G02F 1/13338 |
| 2020/0202099 A1* | 6/2020 | Sun | H01L 27/14623 |
| 2020/0266392 A1* | 8/2020 | Lee | H01L 27/323 |
| 2020/0356205 A1* | 11/2020 | Sun | G06F 3/0412 |

* cited by examiner

ARRAY SUBSTRATE AND MANUFACTURING METHOD THEREOF

FIELD OF INVENTION

The present disclosure relates to the field of display technologies, and more particularly to an array substrate and a manufacturing method thereof.

BACKGROUND OF INVENTION

With mobile displays becoming popular, thin film transistor-liquid crystal displays (TFT-LCDs) overall replace cathode radial tubes (CRTs) and plasma display panels (PDPs). However, in the production of TFT-LCDs, a gate insulating layer in an array substrate easily generates static electricity that damages thin film transistors in the array substrate, thereby causing poor display.

SUMMARY OF INVENTION

An embodiment of the present disclosure provides an array substrate and a manufacturing method thereof. By disposing auxiliary dielectric patterns in the array substrate to absorb major static electricity in the gate insulating layer, thereby reducing the phenomenon of poor display in the array substrate.

An array substrate, comprising:

a plurality of shielding layers disposed on a substrate and arranged at intervals;

a dielectric layer spread on the substrate and covering the shielding layers, the dielectric layer comprising a plurality of dielectric patterns, the dielectric patterns comprising main dielectric patterns and auxiliary dielectric patterns disposed on at least one side of the main dielectric patterns; and a gate insulating layer disposed on the dielectric layer.

In an embodiment of the present disclosure, wherein the dielectric layer is used to absorb static electricity in the gate insulating layer, and cross-sectional areas of the auxiliary dielectric patterns are greater than cross-sectional areas of the main dielectric patterns.

In an embodiment of the present disclosure, wherein the main dielectric patterns partially overlap the shielding layer to form overlapping areas and non-overlapping areas, the auxiliary dielectric patterns do not overlap the shielding layer, and the auxiliary dielectric patterns are disposed among the adjacent main dielectric patterns;

In an embodiment of the present disclosure, the array substrate further comprises a thin film transistor layer disposed on the gate insulating layer, the thin film transistor layer comprises a plurality of thin film transistors, and the thin film transistors are disposed correspondingly to the main dielectric patterns;

wherein source electrodes of the thin film transistors are in the overlapping areas, drain electrodes of the thin film transistors are in the non-overlapping areas, and all of which are electrically connected to the dielectric layer by through-holes.

In an embodiment of the present disclosure, wherein the dielectric layer is used to absorb static electricity in the gate insulating layer, and cross-sectional areas of the auxiliary dielectric patterns are greater than cross-sectional areas of the main dielectric patterns.

In an embodiment of the present disclosure, wherein the dielectric layer is inserted with conductive particles to absorb the static electricity in the gate insulating layer, and a number of positively charged particles is the same as a number of negatively charged particles in the conductive particles.

In an embodiment of the present disclosure, wherein the array substrate further comprises metal blocking layers to block the static electricity in the gate insulating layer;

wherein the metal blocking layers comprise a first blocking layer and a second blocking layer, the first blocking layer is disposed between the shielding layer and the dielectric layer, and the second blocking layer is disposed between the gate insulating layer and the dielectric layer.

In an embodiment of the present disclosure, wherein the auxiliary dielectric patterns are provided with first dielectric capacitors, the main dielectric patterns are provided with second dielectric capacitors, and dielectric constants of the first dielectric capacitors are greater than dielectric constants of the second dielectric capacitors.

In an embodiment of the present disclosure, wherein a spacing among the main dielectric patterns and the auxiliary dielectric patterns are less than or equal to a spacing among the adjacent shielding layers.

In an embodiment of the present disclosure, wherein cross-sectional areas of the auxiliary dielectric patterns range from 40 $\mu m^2$ to 50 $\mu m^2$, and cross-sectional areas of the main dielectric patterns range from 10 $\mu m^2$ to 15 $\mu m^2$.

An embodiment of the present disclosure further provides a manufacturing method of an array substrate. The method comprises:

providing a substrate;

disposing a plurality of shielding layers on the substrate and arranging the shielding layers at intervals;

forming a dielectric layer on the plurality of shielding layers which are arranged at intervals, the dielectric layer comprising a plurality of dielectric patterns, the dielectric patterns comprising main dielectric patterns and auxiliary dielectric patterns disposed on at least one side of the main dielectric patterns; and forming a gate insulating layer on the dielectric layer.

In an embodiment of the present disclosure, wherein in the step of forming a dielectric layer on the plurality of shielding layers which are arranged at intervals, further comprising:

coating a dielectric layer material on a surface of the plurality of shielding layers which are arranged at intervals;

designing a mask according to the dielectric patterns and using photolithography on the dielectric layer material by the mask; and inserting conductive particles into the dielectric layer material after photolithography to form the dielectric layer.

In an embodiment of the present disclosure, wherein the main dielectric patterns partially overlap the shielding layer to form overlapping areas and non-overlapping areas, after the step of forming a gate insulating layer on the dielectric layer, further comprising:

forming a thin film transistor layer on the gate insulating layer, the thin film transistor layer comprising a plurality of thin film transistors, and the thin film transistors are disposed correspondingly to the main dielectric patterns;

wherein source electrodes of the thin film transistors are in the overlapping areas, drain electrodes of the thin film transistors are in the non-overlapping areas, and all of which are electrically connected to the dielectric layer by through-holes.

An embodiment of the present disclosure further provides an array substrate. The array substrate, comprising:

a plurality of shielding layers disposed on a substrate and arranged at intervals;

a dielectric layer spread on the substrate and covering the shielding layers, the dielectric layer comprising a plurality of dielectric patterns, the dielectric patterns comprising main dielectric patterns and auxiliary dielectric patterns disposed on at least one side of the main dielectric patterns; and a gate insulating layer disposed on the dielectric layer;

wherein the main dielectric patterns partially overlap the shielding layer to form overlapping areas and non-overlapping areas, the auxiliary dielectric patterns do not overlap the shielding layer, and the auxiliary dielectric patterns are disposed among the adjacent main dielectric patterns;

wherein the dielectric layer is used to absorb static electricity in the gate insulating layer, and cross-sectional areas of the auxiliary dielectric patterns are greater than cross-sectional areas of the main dielectric patterns.

In an embodiment of the present disclosure, wherein the dielectric layer is used to absorb static electricity in the gate insulating layer, and cross-sectional areas of the auxiliary dielectric patterns are greater than cross-sectional areas of the main dielectric patterns.

In an embodiment of the present disclosure, wherein the array substrate further comprises a thin film transistor layer disposed on the gate insulating layer, the thin film transistor layer comprises a plurality of thin film transistors, and the thin film transistors are disposed correspondingly to the main dielectric patterns;

wherein source electrodes of the thin film transistors are in the overlapping areas, drain electrodes of the thin film transistors are in the non-overlapping areas, and all of which are electrically connected to the dielectric layer by through-holes.

In an embodiment of the present disclosure, wherein the dielectric layer is inserted with conductive particles to absorb the static electricity in the gate insulating layer, and a number of positively charged particles is the same as a number of negatively charged particles in the conductive particles.

In an embodiment of the present disclosure, wherein the array substrate further comprises metal blocking layers to block the static electricity in the gate insulating layer;

wherein the metal blocking layers comprise a first blocking layer and a second blocking layer, the first blocking layer is disposed between the shielding layer and the dielectric layer, and the second blocking layer is disposed between the gate insulating layer and the dielectric layer.

In an embodiment of the present disclosure, wherein the auxiliary dielectric patterns are provided with first dielectric capacitors, the main dielectric patterns are provided with second dielectric capacitors, and dielectric constants of the first dielectric capacitors are greater than dielectric constants of the second dielectric capacitors.

In an embodiment of the present disclosure, wherein a spacing among the main dielectric patterns and the auxiliary dielectric patterns are less than or equal to a spacing among the adjacent shielding layers.

The beneficial effect of the present disclosure is: by disposing auxiliary dielectric patterns in the array substrate and making cross-sectional areas of the auxiliary dielectric patterns greater than cross-sectional areas of the main dielectric patterns to absorb major static electricity in the gate insulating layer, thereby reducing the phenomenon of poor display in the array substrate.

DESCRIPTION OF DRAWINGS

The accompanying figures to be used in the description of embodiments of the present disclosure or prior art will be described in brief to more clearly illustrate the technical solutions of the embodiments or the prior art. The accompanying figures described below are only part of the embodiments of the present disclosure, from which figures those skilled in the art can derive further figures without making any inventive efforts.

DETAILED DESCRIPTION OF PREFERRED EMBODIMENTS

Figure 1:
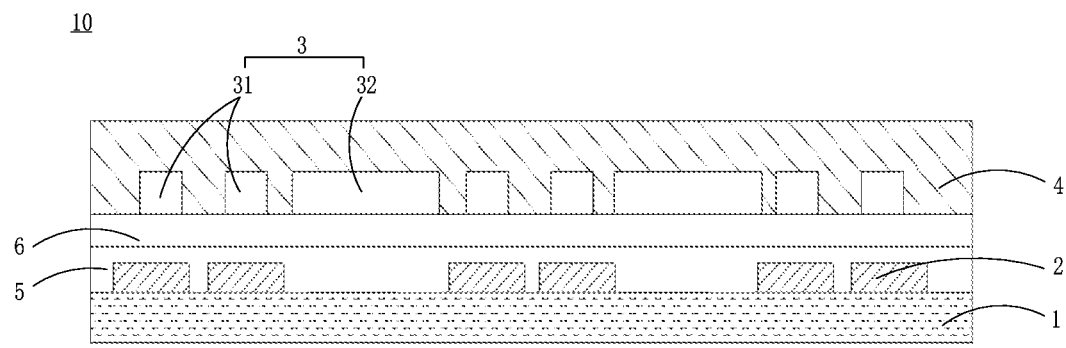
FIG. 1 is a schematic film-layered structural diagram of an array substrate according to an embodiment of the present disclosure.

An embodiment of the present disclosure provides an array substrate and a manufacturing method thereof. By disposing auxiliary dielectric patterns in the array substrate to absorb major static electricity in the gate insulating layer, thereby reducing the phenomenon of poor display in the array substrate.

The embodiments of the present disclosure are described in detail hereinafter. Examples of the described embodiments are given in the accompanying drawings, wherein the identical or similar reference numerals constantly denote the identical or similar elements or elements having the identical or similar functions. In the description of the present disclosure, it should be understood that terms such as "upper," "lower," "front," "rear," "left," "right," "inside," "outside," "side," as well as derivative thereof should be construed to refer to the orientation as described or as shown in the drawings under discussion. These relative terms are for convenience of description, do not require that the present disclosure be constructed or operated in a particular orientation, and shall not be construed as causing limitations to the present disclosure.

It should be noted that, thicknesses and shapes of each layer in the accompanying drawings of the present disclosure do not reflect the real proportions, and the purpose is only to illustrate the content of the embodiments of the present disclosure.

Referring to FIG. 1, FIG. 1 is a schematic film-layered structural diagram of an array substrate according to an embodiment of the present disclosure. The array substrate 10 comprises:

a plurality of shielding layers 2 disposed on a substrate 1 and arranged at intervals;

a dielectric layer 3 spread on the substrate 1 and covering the shielding layers 2, the dielectric layer 3 comprises a plurality of dielectric patterns, the dielectric patterns comprising main dielectric patterns 31 and auxiliary dielectric patterns 32 disposed on at least one side of the main dielectric patterns 31; and a gate insulating layer 4 disposed on the dielectric layer 3.

Specifically, wherein the dielectric layer 3 is used to absorb static electricity in the gate insulating layer 4, and cross-sectional areas of the auxiliary dielectric patterns 32 are greater than cross-sectional areas of the main dielectric patterns 31 that the amounts of static electricity absorbed by the auxiliary dielectric patterns 32 are greater than which absorb by the main dielectric pattern 31 and make the auxiliary dielectric patterns 32 absorb major static electricity in the gate insulating layer 4, thereby reducing the phenomenon of poor display in the array substrate.

It should be noted that, the substrate 1 can be an organic solid, an inorganic solid or a combination of both. The substrate 1 can be rigid or flexible and can be processed into discrete individual parts (such as chips or wafers) or processed into continuous rolls. Conventional substrate materials comprise glasses, plastics, metals, ceramics, semiconductors, metal oxides, metal nitrides, metal sulfides, oxide semiconductors, nitride semiconductors, sulfide semiconductors, carbon, combinations of the above materials or any other materials for OLEDs occasionally used to form passive matrix devices or active matrix devices. The substrate 1 can be a uniform mixture of materials, a composite of materials or multiple layers of materials. The substrate 1 can be an OLED substrate, which is occasionally used for manufacturing OLEDs, such as active matrix low temperature polysilicons or amorphous silicon TFT substrates. Transmission property of a base is not important for the embodiment because light emission from organic light-emitting devices is seen from top electrodes. Therefore, the base can be light transmission, light absorbance, or light reflection.

In an embodiment of the present disclosure, wherein cross-sectional areas of the auxiliary dielectric patterns range from 40 μm² to 50 μm², and cross-sectional areas of the main dielectric patterns range from 10 μm² to 15 μm².

Besides, the glass substrate 1 is covered by the shielding layers 2 and further comprises a first interlayer insulating layer 5 and a second interlayer insulating layer 6. The first interlayer insulating layer 5 and the second interlayer insulating layer 6 work as buffering layers for the array substrate that prevent film layer structures in the array substrate 10 to distortion, materials of which can be a combination of a silicon nitride compound and a silicon oxide compound, for example, the first interlayer insulating layer 5 is a silicon nitride compound and the second interlayer insulating layer 6 is a silicon oxide compound.

Figure 2:
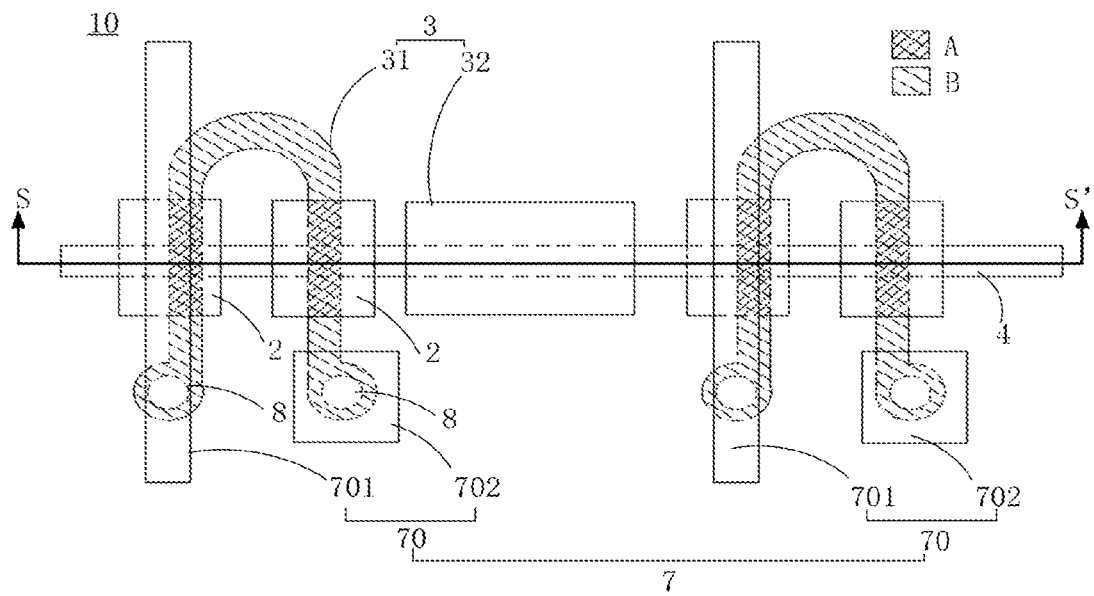
FIG. 2 is a schematic top view diagram of an array substrate according to an embodiment of the present disclosure.

To more clearly illustrate the patterned dielectric layer 3, please refer to FIG. 2. FIG. 2 is a schematic top view diagram of an array substrate according to an embodiment of the present disclosure. In the array substrate 10, the main dielectric patterns 31 partially overlap the shielding layer 2 that the main dielectric patterns 31 form overlapping areas A and non-overlapping areas B with the shielding layer 2.

Wherein the auxiliary dielectric patterns 32 do not overlap the shielding layer 2, and the auxiliary dielectric patterns 32 are disposed among the adjacent main dielectric patterns 31. In an embodiment of the present disclosure, each of the auxiliary dielectric patterns 32 is disposed on at least one side of every two overlapping areas A.

Figure 3:
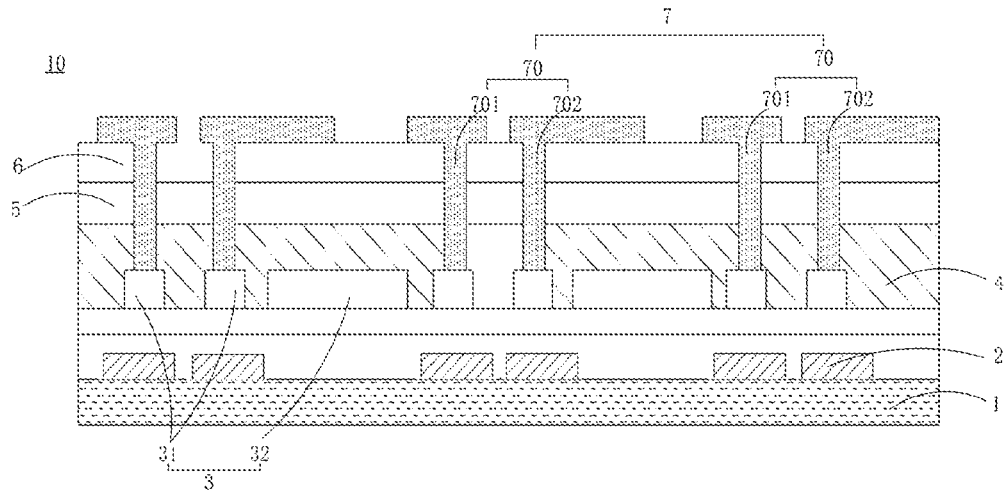
FIG. 3 is a schematic main cross-sectional diagram of the array substrate in FIG. 2.

In an embodiment of the present disclosure, referring to FIG. 2 and FIG. 3, FIG. 3 is a schematic main cross-sectional diagram of the array substrate along the direction of S-S' in FIG. 2. In FIG. 2, the array substrate 10 further comprises a thin film transistor layer 7 disposed on the gate insulating layer 4, wherein the thin film transistor layer comprises a plurality of thin film transistors 70, and the thin film transistors 70 are disposed correspondingly to the main dielectric patterns 31; that is, the thin film transistors 70 correspond to projection positions of the non-overlapping areas B in the main dielectric patterns 31.

wherein source electrodes 701 of the thin film transistors 70 are in the overlapping areas A, drain electrodes 702 of the thin film transistors 70 are in the non-overlapping areas B, and all of which are electrically connected to the dielectric layer 3 by through-holes 8.

In an embodiment of the present disclosure, materials of the dielectric layer 3 comprise one or more selected from the group consisting of crystalline silicon, amorphous silicon, polysilicon, monocrystalline silicon, oxidized amorphous silicon, and combinations thereof. Specifically, those kinds of silicon compound materials make integrated chips made thereof applied in panel substrates have strong feasibilities and the array substrates made thereof have strong stabilities.

In an embodiment of the present disclosure, the dielectric layer 3 is inserted with conductive particles (not shown in the figure) to absorb the static electricity in the gate insulating layer 4, and a number of positively charged particles is the same as a number of negatively charged particles in the conductive particles. For example, when static electricity in the gate insulating layer 4 has a total positive charge, negative charges in the dielectric layer 3 will combine negative charges in the gate insulating layer 4 to absorb the static electricity in the gate insulating layer 4; when static electricity in the gate insulating layer 4 has a total negative charge, positive charges in the dielectric layer 3 will combine positive charges in the gate insulating layer 4 to absorb the static electricity in the gate insulating layer 4.

In an embodiment of the present disclosure, the array substrate 10 further comprises metal blocking layers (not shown in the figure) to block the static electricity in the gate insulating layer; wherein the metal blocking layers comprise a first blocking layer and a second blocking layer (not shown in the figure), the first blocking layer is disposed between the shielding layer 2 and the dielectric layer 3, and the second blocking layer is disposed between the gate insulating layer 4 and the dielectric layer 3.

For example, the metal blocking layers can be metal network structures covering the main dielectric patterns 31. Materials of the metal blocking layers are copper or tinned copper in general that prevent static electricity entering inner layer of main dielectric patterns 31, thereby preventing thin film transistors 70 which correspond to the main dielectric patterns 31 damaged by static electricity and reducing the problem of poor display in the array substrate.

In an embodiment of the present disclosure, wherein the auxiliary dielectric patterns 32 are provided with first dielectric capacitors (not shown in the figure), the main dielectric patterns 31 are provided with second dielectric capacitors (not shown in the figure), and dielectric constants of the first dielectric capacitors are greater than dielectric constants of the second dielectric capacitors.

In an embodiment of the present disclosure, wherein a spacing among the main dielectric patterns 31 and the auxiliary dielectric patterns 32 are not greater than a spacing among the adjacent shielding layers 2.

Figure 4:
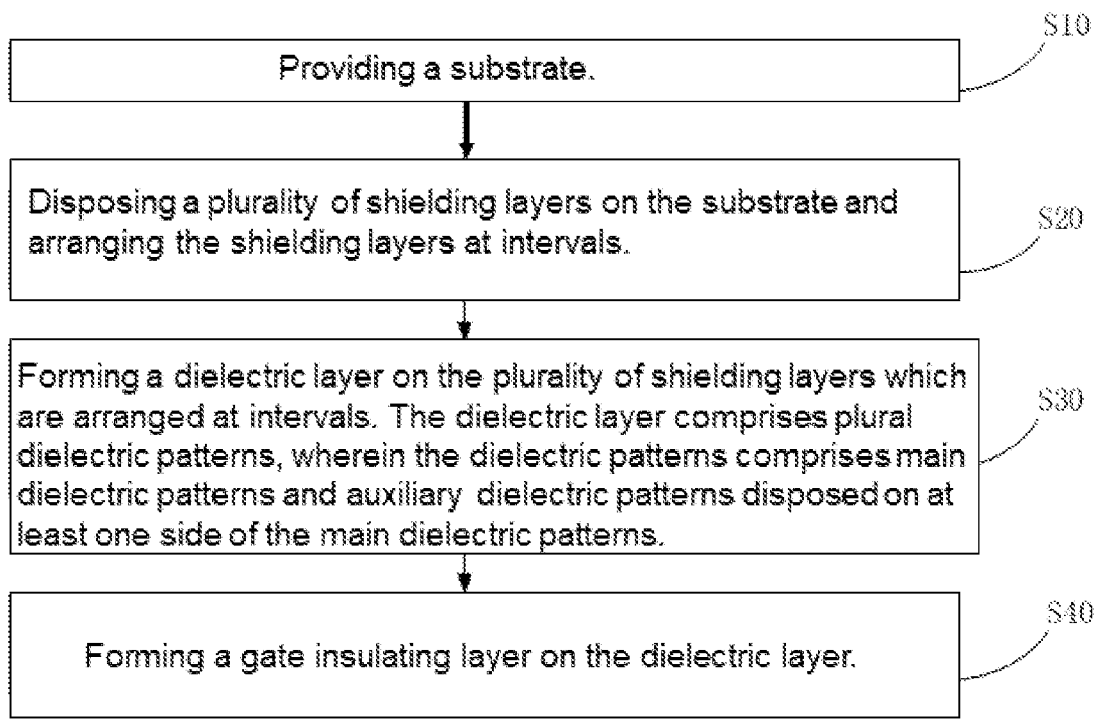
FIG. 4 is a flowchart of a manufacturing method of an array substrate according to an embodiment of the present disclosure.

An embodiment of the present disclosure further provides a manufacturing method of an array substrate. Referring to FIG. 4, FIG. 4 is a flowchart of a manufacturing method of an array substrate according to an embodiment of the present disclosure.

The manufacturing method comprises following steps:
S10: providing a substrate;
S20: disposing a plurality of shielding layers on the substrate and arranging the shielding layers at intervals;
S30: forming a dielectric layer on the plurality of shielding layers which are arranged at intervals. The dielectric layer comprises a plurality of dielectric patterns, wherein the dielectric patterns comprises main dielectric patterns and auxiliary dielectric patterns disposed on at least one side of the main dielectric patterns; and S40: forming a gate insulating layer on the dielectric layer.

It should be noted that, wherein the dielectric layer is used to absorb static electricity in the gate insulating layer, and cross-sectional areas of the auxiliary dielectric patterns are greater than cross-sectional areas of the main dielectric patterns that the amounts of static electricity absorbed by the auxiliary dielectric patterns are greater than which absorb by the main dielectric pattern and make the auxiliary dielectric patterns absorb major static electricity in the gate insulating layer, thereby reducing the phenomenon of poor display in the array substrate.

Besides, the substrate is covered by the shielding layers and further comprises a first interlayer insulating layer and a second interlayer insulating layer. The first interlayer insulating layer and the second interlayer insulating layer work as buffering layers for the array substrate that prevent film layer structures in the array substrate 10 to distortion.

materials of the dielectric layer comprise one or more selected from the group consisting of crystalline silicon, amorphous silicon, polysilicon, monocrystalline silicon, oxidized amorphous silicon, and combinations thereof. Those kinds of materials make integrated chips have strong feasibilities applying in panel substrates and the array substrates have strong stabilities.

In an embodiment of the present disclosure, specifically, wherein S30 further comprises:

S301: coating a dielectric layer material on a surface of the plurality of shielding layers which are arranged at intervals;

S302: designing a mask according to the dielectric patterns and using photolithography on the dielectric layer material by the mask; and S303: inserting conductive particles into the dielectric layer material after photolithography to form the dielectric layer.

In an embodiment of the present disclosure, wherein the main dielectric patterns partially overlap the shielding layer to form overlapping areas and non-overlapping areas. After S40, the method further comprises:

S50: forming a thin film transistor layer on the gate insulating layer. The thin film transistor layer comprises a plurality of thin film transistors, and the thin film transistors are disposed correspondingly to the main dielectric patterns;

wherein source electrodes of the thin film transistors are in the overlapping areas, drain electrodes of the thin film transistors are in the non-overlapping areas, and all of which are electrically connected to the dielectric layer by through-holes.

It should be noted that, the source electrodes of the thin film transistors and the overlapping areas, and the drain electrodes of the thin film transistors and the non-overlapping areas are all electrically connected to the dielectric layer by through-holes.

Based on the same ideas of the present disclosure, an embodiment of the present disclosure further provides a display panel comprising any one of the array substrates according to embodiments of the present disclosure.

Based on the same ideas of the present disclosure, an embodiment of the present disclosure further provides a display device comprising any one of the liquid crystal display panels according to embodiments of the present disclosure. The display devices are any products or parts having display functions, such as cell phones, tablets, TVs, monitors, laptops, digital photo frames, navigators.

The beneficial effect of the present disclosure is: by disposing auxiliary dielectric patterns in the array substrate and making cross-sectional areas of the auxiliary dielectric patterns greater than cross-sectional areas of the main dielectric patterns to absorb major static electricity in the gate insulating layer, thereby reducing the phenomenon of poor display in the array substrate.

In addition to the above described embodiments, the present disclosure may have other embodiments. Any technical solutions formed by equivalent replacements fall within the scope of protection claimed in this application.

The present disclosure has been described with a preferred embodiment thereof. The preferred embodiment is not intended to limit the present disclosure, and it is understood that many changes and modifications to the described embodiment can be carried out without departing from the scope and the spirit of the disclosure that is intended to be limited only by the appended claims.

What is claimed is:

1. An array substrate, comprising:
a plurality of shielding layers disposed on a substrate and arranged at intervals;
a dielectric layer spread on the substrate and covering the shielding layers, the dielectric layer comprising a plurality of dielectric patterns, the dielectric patterns comprising main dielectric patterns and auxiliary dielectric patterns disposed on at least one side of the main dielectric patterns; and
a gate insulating layer disposed on the dielectric layer;
wherein the main dielectric patterns partially overlap the shielding layer to form overlapping areas and non-overlapping areas, the auxiliary dielectric patterns do not overlap the shielding layer, and the auxiliary dielectric patterns are disposed among adjacent main dielectric patterns;
wherein the dielectric layer is used to absorb static electricity in the gate insulating layer, and cross-sectional areas of the auxiliary dielectric patterns are greater than cross-sectional areas of the main dielectric patterns.

2. The array substrate according to claim 1, wherein the array substrate further comprises a thin film transistor layer disposed on the gate insulating layer, the thin film transistor layer comprises a plurality of thin film transistors, and the thin film transistors are disposed corresponding to the main dielectric patterns;
wherein source electrodes of the thin film transistors are in the overlapping areas, drain electrodes of the thin film transistors are in the non-overlapping areas, and the source electrodes of the thin film transistors and the drain electrodes of the thin film transistors are electrically connected to the dielectric layer by through-holes.

3. The array substrate according to claim 1, wherein the dielectric layer is inserted with conductive particles to absorb the static electricity in the gate insulating layer, and a number of positively charged particles is same as a number of negatively charged particles in the conductive particles.

4. The array substrate according to claim 1, wherein the array substrate further comprises metal blocking layers to block the static electricity in the gate insulating layer;
wherein the metal blocking layers comprise a first blocking layer and a second blocking layer, the first blocking layer is disposed between the shielding layer and the dielectric layer, and the second blocking layer is disposed between the gate insulating layer and the dielectric layer.

5. The array substrate according to claim 1, wherein the auxiliary dielectric patterns are provided with first dielectric capacitors, the main dielectric patterns are provided with second dielectric capacitors, and dielectric constants of the first dielectric capacitors are greater than dielectric constants of the second dielectric capacitors.

6. The array substrate according to claim 1, wherein spacings among the main dielectric patterns and the auxiliary dielectric patterns are less than or equal to spacings among adjacent shielding layers.

7. An array substrate, comprising:
a plurality of shielding layers disposed on a substrate and arranged at intervals;
a dielectric layer spread on the substrate and covering the shielding layers, the dielectric layer comprising a plurality of dielectric patterns, the dielectric patterns comprising main dielectric patterns and auxiliary dielectric patterns disposed on at least one side of the main dielectric patterns; and
a gate insulating layer disposed on the dielectric layer.

8. The array substrate according to claim 7, wherein the dielectric layer is used to absorb static electricity in the gate insulating layer, and cross-sectional areas of the auxiliary dielectric patterns are greater than cross-sectional areas of the main dielectric patterns.

9. The array substrate according to claim 7, wherein the main dielectric patterns partially overlap the shielding layer to form overlapping areas and non-overlapping areas, the auxiliary dielectric patterns do not overlap the shielding layer, and the auxiliary dielectric patterns are disposed among adjacent main dielectric patterns.

10. The array substrate according to claim 9, wherein the array substrate further comprises a thin film transistor layer disposed on the gate insulating layer, the thin film transistor layer comprises a plurality of thin film transistors, and the thin film transistors are disposed corresponding to the main dielectric patterns;
wherein source electrodes of the thin film transistors are in the overlapping areas, drain electrodes of the thin film transistors are in the non-overlapping areas, and the source electrodes of the thin film transistors and the drain electrodes of the thin film transistors are electrically connected to the dielectric layer by through-holes.

11. The array substrate according to claim 7, wherein the dielectric layer is inserted with conductive particles to absorb the static electricity in the gate insulating layer, and a number of positively charged particles is same as a number of negatively charged particles in the conductive particles.

12. The array substrate according to claim 7, wherein the array substrate further comprises metal blocking layers to block the static electricity in the gate insulating layer;
wherein the metal blocking layers comprise a first blocking layer and a second blocking layer, the first blocking layer is disposed between the shielding layer and the dielectric layer, and the second blocking layer is disposed between the gate insulating layer and the dielectric layer.

13. The array substrate according to claim 7, wherein the auxiliary dielectric patterns are provided with first dielectric capacitors, the main dielectric patterns are provided with second dielectric capacitors, and dielectric constants of the first dielectric capacitors are greater than dielectric constants of the second dielectric capacitors.

14. The array substrate according to claim 7, wherein spacings among the main dielectric patterns and the auxiliary dielectric patterns are less than or equal to spacings among adjacent shielding layers.

15. The array substrate according to claim 7, wherein cross-sectional areas of the auxiliary dielectric patterns range from 40 $\mu m^2$ to 50 $\mu m^2$, and cross-sectional areas of the main dielectric patterns range from 10 $\mu m^2$ to 15 $\mu m^2$.

16. A manufacturing method of an array substrate, comprising:
providing a substrate;
disposing a plurality of shielding layers on the substrate and arranging the shielding layers at intervals;
forming a dielectric layer on the plurality of shielding layers which are arranged at intervals, the dielectric layer comprising a plurality of dielectric patterns, the dielectric patterns comprising main dielectric patterns and auxiliary dielectric patterns disposed on at least one side of the main dielectric patterns; and
forming a gate insulating layer on the dielectric layer.

17. The manufacturing method of the array substrate according to claim 16, wherein the step of forming the dielectric layer on the plurality of shielding layers which are arranged at intervals, further comprises:
coating a dielectric layer material on a surface of the plurality of shielding layers which are arranged at intervals;
designing a mask according to the dielectric patterns and using photolithography on the dielectric layer material by the mask; and
inserting conductive particles into the dielectric layer material after photolithography to form the dielectric layer.

18. The manufacturing method of the array substrate according to claim 16, wherein the main dielectric patterns partially overlap the shielding layer to form overlapping areas and non-overlapping areas, and after the step of forming the gate insulating layer on the dielectric layer, further comprises:
forming a thin film transistor layer on the gate insulating layer, the thin film transistor layer comprising a plurality of thin film transistors, and the thin film transistors are disposed corresponding to the main dielectric patterns;
wherein source electrodes of the thin film transistors are in the overlapping areas, drain electrodes of the thin film transistors are in the non-overlapping areas, and the source electrodes and the drain electrodes are electrically connected to the dielectric layer by through-holes.

* * * * *